March 6, 1962 C. J. ZAMITES, JR 3,024,430

HIGH FREQUENCY FILTER

Filed May 5, 1959

CHARLES JAMES ZAMITES, JR.
INVENTOR.

BY George C. Thompson, agent
Morris Spector,
ATTORNEY

United States Patent Office 3,024,430
Patented Mar. 6, 1962

3,024,430
HIGH FREQUENCY FILTER

Charles J. Zamites, Jr., Hermosa Beach, Calif., assignor to Thompson Ramo Wooldridge Inc., Los Angeles, Calif., a corporation of Ohio Filed May 5, 1959, Ser. No. 811,112
1 Claim. (Cl. 333—73)

This invention relates to high frequency filters and more particularly to a stack arrangement of capacitor members capable of handling high frequencies without introducing undesirable inductance.

In some high frequency filter arrangements previously used, it has been found difficult to provide the desired filter characteristics when capacitors and inductances were arranged in proper filter relationships.

For example, in a lumped element high pass filter, it is necessary to have series capacitors and shunt inductance. When operating at high frequencies with a lumped element high pass filter, the leads to the capacitor members provide very effective inductance action thus introducing inductance into the series capacitors of the circuit when it is undesired. This type of inductance can be reduced by providing conductors of sufficient size and shape to maintain a low inductance level. However, this does not properly satisfy the needs for a substantially zero inductance reflection in the series capacitor arrangement.

It is, therefore, an object of this invention to provide a stack arrangement of capacitor members capable of eliminating unwanted series inductance.

It is another object of this invention to provide a capacitor stack arrangement to be used with a printed circuit member for providing a compact package usable in strip-line filters.

It is still another object to provide a filter arrangement for forming compact strip-line filters.

Other objects and purposes and character features will become obvious as the description of the invention progresses.

In practicing this invention there is provided a high pass filter having a capacitance portion and an inductive portion. The capacitance portion comprises a stack of a multiple number of capacitor members securely soldered together without the introduction of inductance due to the capacitor leads.

In each of the several views, similar parts bear like reference characters.

Figure 1:
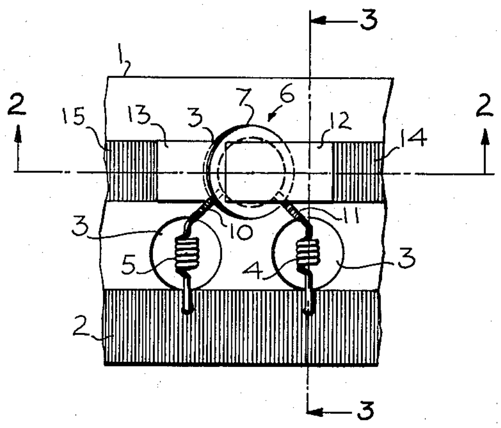
FIGURE 1 is a plan view of a high pass filter utilizing the stack capacitor arrangement of this invention.

In the embodiment of FIGURE 1, there is provided an insulating mounting base or base member 1 made of any suitable dielectric material which is provided with a continuous broad ground or common strip 2 thereacross adjacent to one edge thereof. The strip 2 is constructed of suitable conducting material such as copper. The mounting base 1 is provided with openings or holes 3 therethrough for receiving circuit elements such as suitable inductor portions or inductor members 4 and 5 and a capacitor portion or capacitor stack 6. The capacitor stack 6 comprises a plurality of capacitor members or disc capacitors such as the disc capacitors 7, 8 and 9. The disc capacitors 7, 8 and 9 are securely electrically connected together by any suitable means such as soldering and at the connection between each capacitor member there is provided an output conductor such as the conductors 10 and 11 positioned between the capacitors 8 and 9 and 7 and 8, respectively.

The assembled capacitor stack 6 is then positioned in one of the openings 3 and securely held in place by suitable conducting strips 12 and 13 acting as input and output conductors respectively. The conducting strips 12 and 13 are also suitably secured to a pair of conducting strips 14 and 15 which are secured to the mounting base 1 and appear as substantially wide, flat strips for the purpose of reducing the inductive effect of these members. The mounting base 1 and its conducting strips can be constructed by well known printed circuit techniques.

With the remaining openings 3 provided with suitable inductors 4 and 5 and with these inductors connected to the capacitor stack leads 10 and 11, respectively, and (at their opposite ends) to the ground strip 2, a suitable high pass filter is formed. It can be seen that with a high frequency, such as in the microwave range, applied to the input conductor 14, the capacitor stack 6 will appear as a very low impedance since no inductance can be present in the stack arrangement. The inductances 4 and 5, however, are of proper size to present a high reactance to this frequency range, therefore, allowing passage of this frequency from the strips 12 and 14 to the strips 13 and 15. If we assume, however, that a frequency lower than the filter lower frequency limit is applied to the conductor strip 12, it can be seen that the capacitor stack 6 appears as large impedance to the flow of this frequency while the inductances 4 and 5 appear as reduced impedances or substantially no impedance at all, thus causing the frequency to be grounded to the strip 2.

Figure 3:
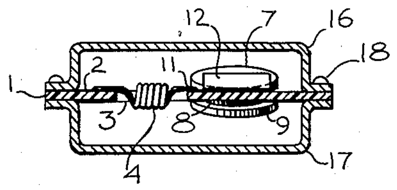
FIGURE 3 is a sectional view of the filter taken along the line 3—3 of FIGURE 1 with shielding added.
Figure 2:
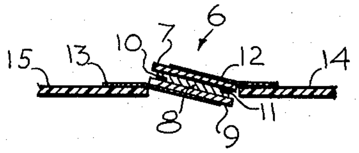
FIGURE 2 is a sectional view taken along the lines 2—2 of FIGURE 1.
Figure 4:
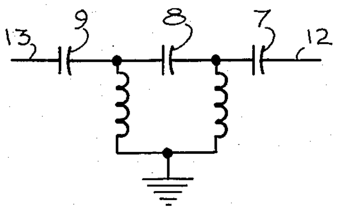
FIGURE 4 is a diagrammatic illustration of the equivalent circuit of FIGURE 1.

The capacitor stack can be used in a strip line-filter if suitable shield members 16 and 17 secured by suitable fasteners 18 are provided, as shown in FIGURE 3. It should be pointed out that the capacitors are equidistant from the shield members for good balance.

Although there is shown a capacitor stack containing only three disc capacitors, it is to be understood that any number of capacitors may be used as desired.

While there has been described what is at present considered a preferred embodiment of the invention, it will be obvious to those skilled in the art that various changes and modifications may be made therein without departing from the invention, and it is aimed in the appended claim to cover all such changes and modifications as fall within the true spirit and scope of the invention.

I claim:

A microwave high pass filter comprising: an insulating planar support; a plurality of flat spaced conductors carried by said support; a plurality of series connected stacked capacitors disposed in an opening in said support and having stack leads at series connections between each of said capacitors, said opening being positioned substantially in alignment with ends of a pair of said conductors; conducting strips each electrically connected to an opposite end of said stacked capacitors and respectively to said ends of said pair of said conductors, said stacked capacitors being substantially equidistant from flat surfaces of said pair of said conductors; a plurality of inductors positioned in openings in said support and having common ends connected to another of said conductors; and means connecting other ends of said inductors individually to said stack leads, said inductors being positioned substantially equidistant from flat surfaces of said conductors and a shield carried by said support, positioned equidistant from said conductors and electrically connected with said another of said conductors.

(References on following page)

References Cited in the file of this patent

UNITED STATES PATENTS

| | | |
|---|---|---|
| 1,314,827 | Osborne | Sept. 2, 1919 |
| 2,065,921 | Gerth | Dec. 29, 1936 |
| 2,619,519 | Marks | Nov. 25, 1952 |

| | | |
|---|---|---|
| 2,751,558 | Grieg | June 19, 1956 |
| 2,844,801 | Sabaroff | July 22, 1958 |
| 2,867,782 | Arditi | Jan. 6, 1959 |
| 2,892,163 | Todd | June 23, 1959 |
| 2,945,195 | Mathaei | July 12, 1960 |